United States Patent
Lehmann et al.

(10) Patent No.: US 8,347,650 B2
(45) Date of Patent: Jan. 8, 2013

(54) METHOD OF PRODUCING A QUARTZ GLASS CRUCIBLE

(75) Inventors: Walter Lehmann, Leipzig (DE); Achim Hofmann, Frankfurt (DE); Thomas Kayser, Leipzig (DE)

(73) Assignee: Heraeus Quarzglas GmbH & Co. KG, Hanau (DE)

( * ) Notice: Subject to any disclaimer, the term of this patent is extended or adjusted under 35 U.S.C. 154(b) by 180 days.

(21) Appl. No.: 12/459,225

(22) Filed: Jun. 29, 2009

(65) Prior Publication Data

US 2009/0320521 A1    Dec. 31, 2009

(30) Foreign Application Priority Data

Jun. 30, 2008    (DE) .......................... 10 2008 030 310

(51) Int. Cl.
 *C03B 19/09*    (2006.01)
(52) U.S. Cl. ............. 65/17.3; 65/17.4; 65/17.5; 65/17.6
(58) Field of Classification Search ........... 65/17.3–17.6
 See application file for complete search history.

(56) References Cited

U.S. PATENT DOCUMENTS

| | | | |
|---|---|---|---|
| 4,632,686 A | | 12/1986 | Brown et al. |
| 6,548,131 B1 * | | 4/2003 | Fabian et al. ................. 428/34.4 |
| 6,886,364 B2 * | | 5/2005 | Ohama et al. .................. 65/17.3 |
| 8,047,020 B2 | | 11/2011 | Fujita et al. |
| 2002/0166340 A1 * | | 11/2002 | Kemmochi et al. ............. 65/17.3 |
| 2004/0045659 A1 * | | 3/2004 | Kobayashi .................... 156/230 |
| 2005/0235907 A1 * | | 10/2005 | Ohama et al. ................. 117/200 |
| 2010/0162760 A1 | | 7/2010 | Fujita et al. |

FOREIGN PATENT DOCUMENTS

WO    WO2009/017071    2/2009

OTHER PUBLICATIONS

M. N. Rahaman. Ceramic Processing and Sintering. New York: Marcel Dekker, 1995. pp. 264-272.*

* cited by examiner

*Primary Examiner* — Matthew Daniels
*Assistant Examiner* — Russell Kemmerle, III
(74) *Attorney, Agent, or Firm* — Tiajoloff & Kelly LLP

(57) ABSTRACT

A method of producing a quartz glass crucible for pulling a single crystal comprising: providing a melting mold comprising a wall having passages between outside and inside; providing an outer layer granulation consisting of first coarser $SiO_2$ particles and forming an outer granulation layer from the outer layer granulation on the inside of the melting mold wall; providing a barrier layer granulation consisting of second finer $SiO_2$ particles and forming a barrier granulation layer from the barrier layer granulation on the outer granulation layer; applying a negative pressure to the outside of the melting mold wall; and heating the barrier granulation layer and the outer granulation layer with formation of a quartz glass crucible with transparent inner layer. In order to produce a sealing layer that is as thin and uniform as possible it is suggested that the $SiO_2$ particles of the barrier layer granulation should have a mean particle size ($D_{50}$ value) of less than 50 µm and that the formation of the barrier granulation layer should include a measure for fixing the barrier layer granulation to the outer granulation layer.

13 Claims, 2 Drawing Sheets

METHOD OF PRODUCING A QUARTZ GLASS CRUCIBLE

Figure 1:
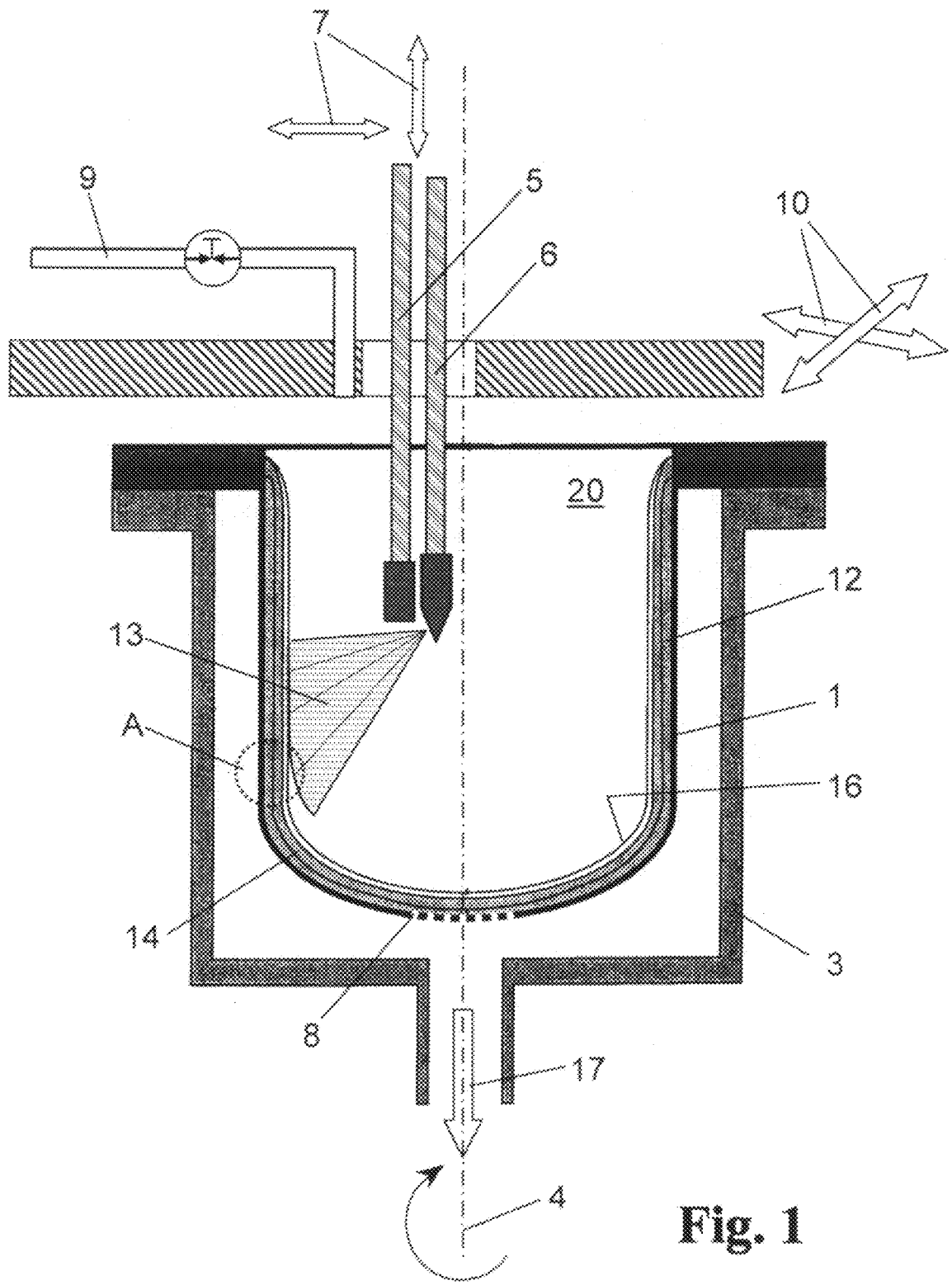

The present invention relates to a method of producing a quartz glass crucible for pulling a single crystal, the method comprising the following steps:
(a) providing a melting mold comprising a wall having an inside, an outside and passages between outside and inside;
(b) providing an outer layer granulation consisting of first coarser $SiO_2$ particles and forming an outer granulation layer from the outer layer granulation on the inside of the melting mold wall;
(c) providing a barrier layer granulation consisting of second finer $SiO_2$ particles and forming a barrier granulation layer from the barrier layer granulation on the outer granulation layer;
(d) applying a negative pressure to the outside of the melting mold wall;
(e) heating the barrier granulation layer and the outer granulation layer with formation of a quartz glass crucible with transparent inner layer.

PRIOR ART

Quartz glass crucibles are used for receiving the metal melt during pulling of single crystals according to the so-called Czochralski method. They are normally produced by forming a layer of $SiO_2$ granulation on the inner wall of a metallic metal mold and by heating said layer using an electric arc (plasma) and sintering the same in this process to obtain the quartz glass crucible. The wall of the quartz glass crucible produced in this way is normally made up of a transparent inner layer and an opaque outer layer.

The transparent inner layer is in contact with the silicon melt in the pulling process and is subjected to high mechanical, chemical and thermal loads. Small residual bubbles that have remained in the inner layer are growing under the influence of temperature and pressure and may burst in the end, whereby fragments and impurities will pass into the silicon melt, resulting in a lower yield of dislocation-free silicon monocrystal.

To reduce the corrosive attack of the silicon melt and, together with this, to minimize the release of impurities from the crucible wall, the inner layer should therefore be as homogeneous and poor in bubbles as possible. To improve these properties, crucible manufacturing methods are known with a vacuum-supported formation of the inner layer. A vacuum melting mold is here used having a porous wall and provided with a multitude of continuous bores, so that, upon application of a negative pressure to the melting mold outside, gases can be drawn off from the $SiO_2$ granulation layer to the exterior.

Such a vacuum-type manufacturing method and a method of the above-mentioned type are known from U.S. Pat. No. 4,632,686 A. In this method a layer of coarse quartz glass powder with particle diameters ranging from 100 μm to 300 μm is first introduced into a vacuum-type melting mold and molded into an outer granulation layer on the inner wall. The inside of the outer granulation layer has applied thereto an inner granulation layer consisting of a finer quartz glass powder. The diameter of the powder particles is within the range between 44 μm and 120 μm, i.e. the geometric average is a particle size of around 80 μm. On account of the relatively high packing density of the finer powder particles, these particles let less air pass when a vacuum is applied from the outside of the melting mold, thereby acting as a barrier layer permitting the generation of a stronger vacuum, which in turn contributes to a more efficient removal of entrapped gases from the granulation layers. This has the effect that during sintering of the granulation layers from the inside, due to the introduction of a plasma source into the interior of the melting mold, the finely divided quartz glass powder will first fuse, thereby forming a dense glass layer. As soon as the glass layer has been formed, the negative pressure can be increased even further. It is only under the action of this increased vacuum that a really low-bubble inner layer can be melted.

Although the previously produced glass layer is dense, it includes a great number of bubbles because of the absence of an adequately high vacuum. This layer that is dense but not free from bubbles will here be called "sealing layer". The bubble-containing sealing layer must be removed before the intended use of the quartz glass crucible. To keep the efforts for this small, a sealing layer is desired that is as thin as possible. Moreover, it has been found that the sealing layer can be formed with a locally varying thickness. Removal without impairment of the underlying bubble-free layer is thereby rendered difficult. For instance, to completely etch off thick portions of the sealing layer, not only the thinner layer portions of the sealing layer are removed, but the underlying portions of the bubble-free inner layer are also taken away locally. Moreover, due to local differences in the formation of the sealing layer, inhomogeneities may easily arise during formation of the sealing layer, particularly in the transition area between the bottom and the side wall of the crucible, which will be noticed during the subsequent formation of the bubble-free inner layer.

TECHNICAL OBJECT

It is therefore the object of the present invention to improve the above-mentioned method such that a sealing layer that is as thin and uniform as possible can be formed and thus in conjunction therewith a homogeneous inner layer can be produced in a reproducible manner.

Starting from the method of the above-mentioned type, this object is achieved according to the invention in that the $SiO_2$ particles of the barrier layer granulation have a mean particle size ($D_{50}$ value) of less than 50 μm and that the formation of the barrier granulation layer includes a measure for fixing the barrier layer granulation to the outer granulation layer.

An outer granulation layer consisting of relatively coarse-grained outer layer granulation is produced on the melting mold wall. This type of $SiO_2$ granulation with mean particle sizes of more than 50 μm shall also be called "coarse granulation" in the following. One or more further $SiO_2$ granulation layers are provided between the outer granulation layer and the wall of the melting mold.

A barrier granulation layer of barrier layer granulation that contains finely divided $SiO_2$ particles is directly applied to the outer granulation layer. This type of $SiO_2$ granulation with mean particles sizes of less than 50 μm shall also be called "fine granulation" in the following. The barrier granulation layer forms the innermost granulation layer.

When the barrier granulation layer is applied, or also thereafter, a negative pressure is applied to the outside of the melting mold wall, said pressure being noticed in the interior of the melting mold because of the porosity of the granulation layers, and the gas contained therein is therefore sucked off through the granulation layers.

The granulation layers are subsequently heated. The granulation layers are normally heated under the action of an electric arc, as is known from the prior art. In the course of the heating process the $SiO_2$ granulation layers are sintered to obtain the quartz glass crucible with opaque outer layer and transparent inner layer. The transparent inner layer is here formed from vitrified fine granulation and/or from another $SiO_2$ granulation.

In the method according to the invention a barrier layer granulation is used that is distinguished by a low mean particle size of less than 50 μm. This finely divided granulation acts not only as a mechanical barrier layer in that, when a vacuum is applied to the outer wall of the melting mold, it impedes the aspiration of atmosphere from the interior of the melting crucible, but it is particularly distinguished by a high sintering activity.

The high sintering activity has the effect that the barrier layer granulation is sintered particularly evenly, i.e. without local inhomogeneities, at a comparatively low temperature and within a short heating period into a dense glassy sealing layer. Hence, this sealing layer is uniformly formed over the whole inner wall of the crucible, thereby permitting the rapid application of a stronger vacuum, which reduces the bubble density of the deeper-positioned layers during further sintering.

At a given power of the electric arc the minimum thickness of the sealing layer follows from the heating period that is needed for completely sealing the barrier granulation layer. Due to the high sintering activity of the barrier layer granulation the surface is sealed evenly and completely at a fast pace, so that the stronger vacuum is applied relatively early and the thickness of the bubble-containing sealing layer formed at a low vacuum can be kept relatively small.

The high sintering activity of the fine granulation is achieved through the fine division thereof and, associated therewith, through a high BET specific surface area. These properties, however, make handling under the standard process conditions of crucible manufacture difficult or altogether impossible on the other hand. In particular, it may easily happen that the finely divided granulation is blown away under the action of the arc pressure and by gas streams and thermal convection in the interior of the melting mold, which makes it difficult to produce a barrier granulation layer of a uniform thickness.

Another challenge in the method according to the invention is therefore the fixation of the finely divided barrier granulation to the outer granulation layer to thereby immobilize the granulation substantially as a uniform layer of a desired thickness. It is only through a substantial immobilization of the granulation that it is possible to form a barrier granulation layer of uniform thickness. Immobilization is preferably achieved by intensifying the adhesion forces between the particles of the barrier layer granulation and the outer granulation layer, as shall be explained further below in more detail.

It is only the interaction between a uniform and preferably thin barrier granulation layer and the high sintering activity of the evolving $SiO_2$ granulation that it is possible to form the desired, evenly thin sealing layer. Since the outer granulation layer that is directly adjacent to the barrier granulation layer consists of coarser $SiO_2$ particles, a significant decrease in the sintering activity is observed while the sintering front is progressing from the inside to the outside, so that the thickness of the sealing layer can be exactly predetermined on the basis of the thickness of the barrier granulation layer.

A particularly high sintering activity of the barrier layer granulation is accomplished when the $SiO_2$ particles of the barrier layer granulation have a mean particle size ($D_{50}$ value) of less than 30 μm, preferably a mean particle size ($D_{50}$ value) of less than 20 μm.

Mean particle sizes of less than 1 μm, however, are not preferred since such fine particles tend to form agglomerations, apart from the above-explained problems created by the ease of being blown away, which makes their processing into a uniform barrier granulation layer difficult in addition. The determination of the $D_{50}$ value of the particle size distribution is in conformity with DIN 725-5 (2007-04).

Preferably, the $SiO_2$ particles of the outer layer granulation have a mean particle size ($D_{50}$ value) of more than 100 μm, particularly preferably a mean particle size ($D_{50}$ value) of more than 120 μm.

This primarily facilitates the handling of the granulation in the crucible manufacturing process. Moreover, this creates a significant difference between the sintering activities of the $SiO_2$ granulations of the barrier granulation layer and the outer granulation layer adjoining it.

Furthermore, it has turned out to be advantageous when the $SiO_2$ particles of the barrier layer granulation have a multimodal particle size distribution, with a first maximum of the size distribution in the range of from 0.03 μm to 2 μm and a second maximum in the range of from 3 μm to 50 μm.

The $SiO_2$ particles of the barrier layer granulation are here present in a particle size distribution having two or more maxima. At least one of the maxima, namely a secondary maximum, is in the finely divided range with particle diameters below 2 μm, a further maximum, i.e. the main maximum, is present within the coarse-grained range with particle sizes above 3 μm. Such a multimodal particle size distribution with at least two granulation distributions clearly differing from each other in their mean size helps to set a high packing density of the granulation layer (high bulk density or tap density), which, promoted by the particularly finely divided fraction of the granulation, makes a considerable contribution to the desired high sintering activity. The reason is that small $SiO_2$ particles (in the μm range) have a relatively high specific outer surface, with BET values between 1 and 20 $m^2/g$. This improves the sintering activity of the barrier granulation layer, so that a closed-pore surface is already formed by sintering under a comparatively low thermal load (lower sintering temperature and/or shorter sintering duration). This is particularly also true for $SiO_2$ particles with particle sizes in the nanometer range (<100 nm, with BET surface areas of more than 40 $m^2/g$), as obtained e.g. as pyrogenic soot in the manufacture of synthetic quartz glass by oxidation or flame hydrolysis of silicon-containing start substances. Particles of such a small size and in a great amount entail, however, a comparatively strong shrinkage during sintering of the granulation layer, which may lead to the formation of cracks. Therefore, their weight fraction in the $SiO_2$ granulation layer is limited to 20% at the most.

Moreover, it has turned out to be advantageous when a dopant which reduces the viscosity of quartz glass is added to the barrier layer granulation.

The softening temperature of the $SiO_2$ granulation is here lowered by the addition of one or more dopants, which leads to a particularly rapid densification of the granulation layer during heating. In the event that the doped granulation is exclusively used for forming the sealing layer and said layer is removed prior to the intended use of the quartz glass crucible, the resulting bubble-free inner layer does not contain the dopant.

A preferred measure for fixing the barrier layer granulation comprises wetting the outer granulation layer before or during formation of the barrier granulation layer.

The wetting of the outer granulation layer effects an increase in adhesion forces relative to the barrier layer granulation applied thereto, which contributes to the immobilization thereof in the form of a barrier granulation layer. The outer granulation layer is formed either from wetted outer layer granulation, or it is wetted prior to the application of the barrier layer granulation, e.g. by applying a liquid, such as water or alcohol, by spraying. Wetting, however, can also be carried out during application of the barrier layer granulation.

As an alternative or in addition, it has also turned out to be useful when the measure for fixing the barrier layer granulation comprises a wetting of the barrier granulation layer.

The barrier layer granulation is normally wetted only insignificantly, resulting in a moisture content of less than 4%. As an alternative, the barrier layer granulation can e.g. be absorbed in a suspension or applied in dispersed from in a silica gel to the outer granulation layer. The barrier layer granulation may be wetted before, during or after the generation of the barrier granulation layer. In comparison with the wetting of the outer granulation layer this measure has the advantage that moisture is introduced only near the surface and can thus be more easily removed again in the course of the crucible manufacturing process.

In the simplest case water vapor is used for wetting. Water considerably intensifies the adhesion forces between the granulation particles and offers the further advantage when used for wetting the barrier layer granulation that it reduces the viscosity thereof, which facilitates the generation of a dense sealing layer. On the other hand, attention must be paid that the hydroxyl group content of the near-surface layers of the quartz glass crucible, particularly the bubble-free inner layer, does not become too high since, otherwise, this would be detrimental to the thermal stability of the quartz glass crucible.

In this respect a procedure has turned out to be useful in which a water-free liquid is used for wetting.

This reduces the introduction of hydroxyl groups and thus the risk of a considerable decrease in the thermal stability of the quartz glass crucible. Organic liquids, for instance, are suited as water-free or hydroxyl-free liquids.

Furthermore, a measure for fixing the barrier layer granulation has turned out to be useful that comprises applying barrier layer granulation to a flexible flat auxiliary body and fixing on the auxiliary body, which is subsequently placed with the barrier layer granulation fixed thereto on the outer granulation layer.

The barrier layer granulation is here e.g. provided in the form of a liquid suspension or a pasty mass and is applied to a flexible surface structure of a predetermined layer thickness. The planar structure may e.g. be an arrangement in the form of a conglomerate, network or grid of fibers, stripes or yarns. After the planar structure has been coated, and possibly after the coating mass has dried, it is placed on the outer granulation layer. The planar structure may e.g. consist of quartz glass; preferably, however, it is made of cellulose and is incinerated in the further crucible manufacturing process.

A procedure is preferred in which heating according to method step (e) comprises a two-stage heating process, with a first heating stage during which the barrier granulation layer is vitrified at a lower temperature, and with a second heating stage during which the outer granulation layer is heated at a higher temperature and is thereby sintered at least in part.

Due to the high sintering activity the barrier layer granulation is already vitrified at a temperature that is so low that the adjoining coarse granulation remains still porous and thus gas-permeable. This produces a sealing layer of a defined thin wall thickness on a still continuously porous base. Since only the sinter-active barrier layer granulation is sintered, the sealing layer consists completely of sintered barrier layer granulation, namely with a layer thickness predetermined by the barrier layer granulation layer. After the dense sealing layer has been formed, the intensity of the vacuum is increased, so that gases are removed from the still fully porous outer granulation layer, and in the second heating stage the outer granulation layer is thereupon sintered at an elevated temperature.

It has turned out to be advantageous when the transition from the first to the second heating stage takes place after complete vitrification of the barrier granulation layer.

This yields a defined thickness of the sealing layer.

With respect to a sealing layer that is gas-tight on the one hand, but as thin as possible on the other hand, a procedure is preferred in which the barrier granulation layer is formed at a layer thickness ranging from 0.3 mm to 5 mm, preferably a layer thickness of less than 3 mm.

At a relative density of the barrier granulation layer of about 80% (based on the density of quartz glass), this yields thicknesses for the sealing layer in the range of about 0.2 mm to 4 mm, preferably of less than 2.4 mm, after sintering of the barrier granulation layer.

A bubble-containing $SiO_2$ sealing layer which is present on the inner wall of the quartz glass crucible is preferably removed by burning off by means of plasma.

With the burning off of the sealing layer by means of plasma during the crucible manufacturing process, an additional working step is avoided, such as e.g. during removal of the sealing layer by sand blasting or chemical etching.

EMBODIMENT

Figure 2:
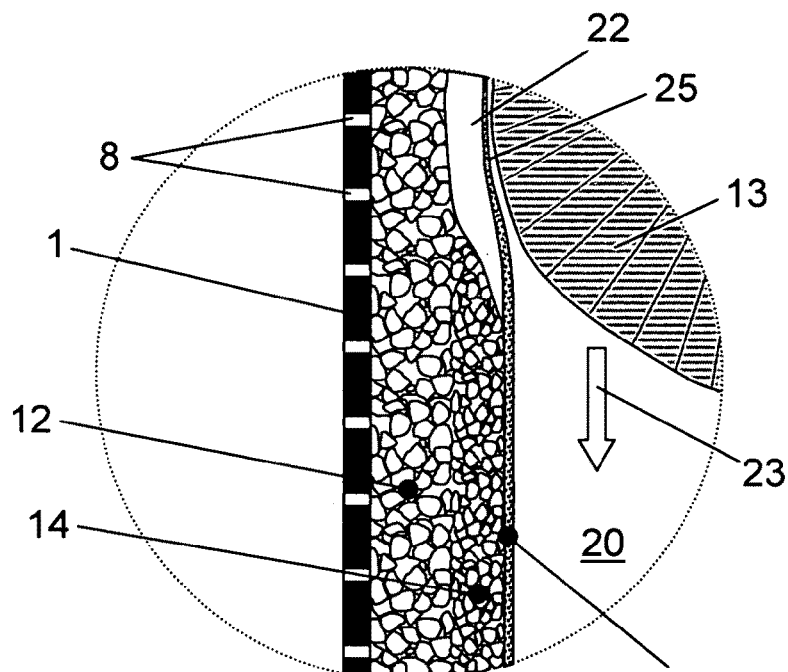
Figure 3:
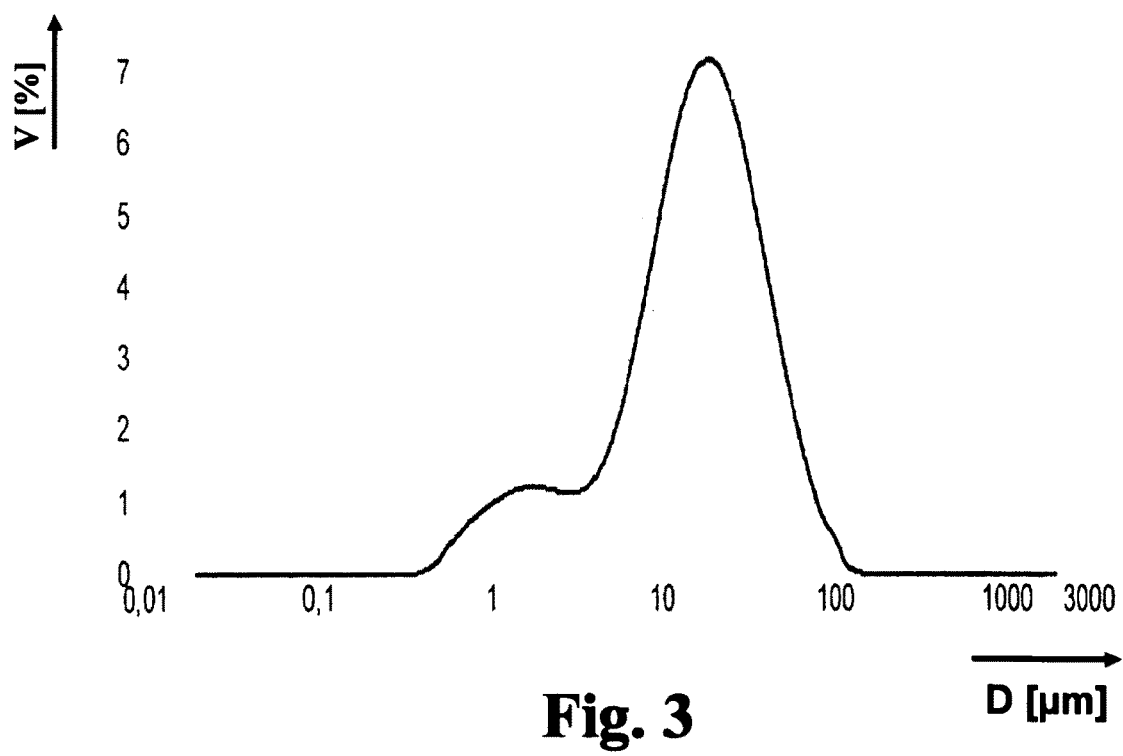

The invention shall now be explained in more detail with reference to embodiments and a drawing, in which FIG. 1 is a schematic illustration showing a melting device for performing the method according to the invention in the method step in which the wall of the quartz glass crucible is vitrified;

FIG. 2 shows section "A" of the wall of the quartz glass crucible of FIG. 1 after formation of the sealing layer, on an enlarged scale; and FIG. 3 is a diagram showing the $SiO_2$ particle size distribution of a raw material component for use in the method of the invention.

The melting device according to FIG. 1 comprises a melting mold 1 of metal which has an inner diameter of 75 cm and which rests with an outer flange on a carrier 3. The carrier 3 is rotatable about a central axis 4. A cathode 5 and an anode 6 (electrodes 5; 6) of graphite which, as illustrated by directional arrows 7, are movable inside the melting mold 1 in all spatial directions project into the interior 20 of the melting mold 1.

A heat shield 2 in the form of a water-cooled metal plate with a thickness of 10 mm projects beyond the open upper side of the melting mold 1, the heat shield having a central through bore through which the electrodes 5, 6 project into the melting mold 1. The heat shield 2 is connected to a gas inlet 9 for water vapor. A venting gap with a width of 50 mm is provided between the melting mold 1 and the heat shield 2 (FIG. 1 shows this dimension and all of the other dimensions of the device only schematically, not true to scale). The heat shield 2 is movable in the plane above the melting mold 1 in horizontal direction (in x- and y-direction) as illustrated by the directional arrows 10.

The space between the carrier 3 and the melting mold 1 can be evacuated by means of a vacuum device, which is represented by the directional arrow 17.

The melting mold 1 comprises a plurality of passages 8 (these are illustrated in FIG. 1 only symbolically in the bottom region) through which the vacuum 17 applied to the outside 3 of the mold 1 can act inwardly.

The manufacture of a 28" quartz glass crucible according to the invention shall now be explained in more detail with reference to a preferred embodiment.

In a first method step crystalline granulation of natural quartz sand cleaned by hot chlorination and having a grain size ranging from 90 μm to 315 μm is filled into the melting mold 1, which is rotating about its longitudinal axis 4. A rotation-symmetrical crucible-shaped granulation layer 12 of mechanically consolidated quartz sand is formed on the inner wall of the melting mold 1 under the action of the centrifugal force and by means of a shaping template. The mean layer thickness of the granulation layer 12 is about 12 mm.

In a second method step an inner granulation layer 14 of synthetically produced quartz glass powder is formed on the inner wall of the quartz sand layer 12 also by using a shaping template and under continued rotation of the melting mold 1.

The synthetic quartz powder has particle sizes in the range of 50 μm to 120 μm, the mean particle size being about 85 μm. The mean layer thickness of the inner granulation layer 14 is also about 12 mm.

The granulation layer 12 and the inner granulation layer 14 together form an "outer granulation layer" within the meaning of this invention. In a third method step, a further $SiO_2$ granulation layer (16) with a mean thickness around 3 mm is formed from a "barrier layer granulation" on the outer granulation layer (12; 14) also by using a shaping template and under continued rotation of the melting mold 1.

FIG. 3 shows a typical particle size distribution of the barrier layer granulation used therefor. The volume fraction V (in %) of the granulation is plotted on the y-axis of the diagram and the particle diameter D (in μm) on the x-axis. The barrier layer granulation consists of spherical, synthetically produced $SiO_2$ particles that are distinguished by a multimodal particle size distribution with a relatively narrow maximum of the size distribution at about 15 μm ($D_{50}$ value). A secondary maximum is in the range around 2 μm. The barrier layer granulation is first cleaned in a hot chlorination method. The impurity content of the cleaned barrier layer granulation is low and is less than 1 wt. ppm on the whole.

Due to the small particle size and the accompanying high fluidity of the barrier layer granulation, measures are needed for fixing the barrier granulation layer 16. On the one hand prior to the formation of the barrier granulation layer 16 the inner granulation layer 14 is sprayed with water and thereby wetted. Thereupon the heat shield 2 is positioned above the opening of the melting mold 1, and water vapor for wetting the barrier granulation layer 16 is introduced into the interior of the crucible via the inlet 9 before the plasma 13 is ignited. The barrier granulation layer 16 is thereby also additionally fixed in its shape.

In a further method step the granulation layers 12,14 and 15 are vitrified. The electrodes 5; 6 are introduced through the central opening of the heat shield 2 into the interior 20 and an electric arc is ignited between the electrodes 5; 6, which arc is marked in FIG. 1 by the plasma zone 13 as a region highlighted in gray. At the same time a vacuum is applied to the outside of the melting mold 1; the vacuum, however, is also operative in the interior 20 of the melting mold 1 due to the porous $SiO_2$ granulation layers 12, 14; 16 so that at this process stage an adequately high vacuum is not achievable.

A three-stage vitrification process is employed for vitrifying the granulation layers 12; 14; 16. In the first vitrification stage the electrodes 5; 6 are brought into a central position of the interior 20 and are powered with about 270 kW (200 V, 1350 A). The heat generated thereby in the interior 20 is enough for sintering the particularly sinter-active particles of the barrier granulation layer 16, whereby a gapless dense sealing layer 21 is formed very rapidly and evenly over the whole inner wall of the crucible (see FIG. 2), and although the sealing layer 21 contains bubbles, it separates the non-fused portions of the crucible wall from the atmosphere in the interior 20 of the melting mold. The thickness of the sealing layer follows from the heating duration needed for the complete sealing at a given power of the plasma 13. The heating period in the method according to the invention is about half as long as the period in the method according to the prior art, so that the sealing layer 21 is also formed with only about half the thickness.

As soon as the barrier granulation layer 16 has fused completely and a closed sealing layer 21 has been formed, the second vitrification stage starts. Since the pumping-off action via the vacuum device 17 is continued, a negative pressure of about 200 mbar (absolute) is created in the outer granulation layer 12; 14 that has not been vitrified yet. The electrodes 5; 6 are now powered with 600 kW (300 V, 2000 A) and are brought together with the heat shield 2 into the lateral position shown in FIG. 1 so as to vitrify the granulation layers 12; 14 in the area of the side wall.

This vitrification stage is explained in more detail with reference to FIG. 2, which shows a section "A" of the crucible wall on an enlarged scale. After completion of the uniformly thick, bubble-containing, but dense, sealing layer 21 the negative pressure in the area of the granulation layers 12,14 is about 200 mbar (absolute), and the electrodes 5; 6 are powered with 600 kW. The plasma zone 12 is moved slowly downwards, as illustrated by the directional arrow 23, and the inner layer granulation 14 is fused continuously and portion by portion in this process into a bubble-free inner layer 22. The uniformity and the small thickness of the previously produced sealing layer 21 are also conducive to a substantially constant thickness of the inner layer 22. During vitrification the bubble-containing sealing layer 21 is partly burned off under the action of the plasma 13, so that only a thin film 25 with a thickness of less than 1 mm remains of it.

For vitrifying the granulation layers 12; 14 in the area of the bottom, heat shield 2 and electrodes 5; 6 are moved into a central position and the electrodes 5; 6 are lowered downwards.

Due to the enhanced vacuum after formation of the sealing layer 21, a dense, low-bubble and therefore transparent inner layer 22 is formed from the inner granulation layer 14 during vitrification of the granulation layers 12; 14 underneath the sealing layer 21.

As soon as the transparent inner layer 22 has reached a thickness of about 2.5 mm, the suction power of the vacuum device 17 is reduced in the third vitrification stage via a throttle valve (not shown in FIG. 1) such that the pressure in the still unvitrified portions of the granulation layers 12; 14 rises to 900 mbar (absolute pressure). The gas needed for this emanates particularly from the interior 20 of the melting mold 1, from which it exits through the unfused portions of the granulation layers 12; 14 via the openings 8 of the mold wall.

The melting process will be terminated before the melt front has reached the inner wall of the melting mold 1.

The thin non-transparent sealing layer which covers the transparent inner layer is burnt off at least partially during the second and third vitrification stage due to the action of the plasma 13. Possible residues are completely eliminated at the end of the manufacturing process by way of chemical etching. The inner surface of the quartz glass crucible manufactured in this way is thus formed by a smooth, low-bubble and evenly thick inner layer 22 of synthetic $SiO_2$, which is firmly connected to an outer layer of opaque quartz glass. The inner layer 22 produced in this way is also distinguished by a small bubble growth during the intended use of the crucible.

The invention claimed is:

1. A method of producing a quartz glass crucible for pulling a single crystal, the method comprising:
   a. providing a melting mold comprising a wall having an inside, an outside and passages between the outside and inside;
   b. providing an outer layer granulation of first $SiO_2$ particles, and forming an outer granulation layer from the outer layer granulation on the inside of the melting mold wall;
   c. providing a barrier layer granulation of second $SiO_2$ particles, said second $SiO_2$ particles being finer than the first $SiO_2$ particles, and forming a barrier granulation layer from the barrier layer granulation on the outer granulation layer;
   d. applying a negative pressure to the outside of the melting mold wall;
   e. heating the barrier granulation layer and the outer granulation layer so as to form the quartz glass crucible with a transparent inner layer;
   wherein the $SiO_2$ particles of the barrier layer granulation have a $D_{50}$ value of less than 50 µm and wherein the formation of the barrier granulation layer includes fixing the barrier layer granulation to the outer granulation layer;
   wherein the fixing of the barrier layer granulation comprises wetting the barrier granulation layer with a liquid;
   wherein the heating comprises a two-stage heating process, including a first heating stage during which the barrier granulation layer is vitrified at a low temperature, and a second heating stage during which the outer granulation layer is heated at an elevated temperature higher than said low temperature and thereby sintered at least in part; and
   wherein the granulation barrier layer is formed so as to have a thickness of less than 3 mm.

2. The method according to claim 1, wherein the $SiO_2$ particles of the barrier layer granulation have a $D_{50}$ value of less than 30 µm.

3. The method according to claim 1, wherein the $SiO_2$ particles of the outer layer granulation have a $D_{50}$ value greater than 100 µm.

4. The method according to claim 1, wherein the $SiO_2$ particles of the barrier layer granulation have a multimodal particle size distribution, with a first maximum of the size distribution in a range of 0.03 µm to 2 µm and a second maximum in a range of 3 µm to 50 µm.

5. The method according to claim 1, wherein a dopant that reduces the viscosity of quartz glass is added to the barrier layer granulation.

6. The method according to claim 1, wherein the fixing of the barrier layer granulation comprises wetting the outer granulation layer before or during formation of the barrier granulation layer.

7. The method according to claim 1, wherein the liquid of the wetting of the barrier granulation layer is a water-free liquid.

8. The method according to claim 1, wherein the fixing the barrier layer granulation comprises applying the barrier layer granulation to a flexible flat auxiliary body and fixing the barrier layer granulation on the auxiliary body, and subsequently placing the barrier layer granulation fixed thereto on the outer granulation layer.

9. The method according to claim 1, wherein the second heating stage does not commence until after complete vitrification of the barrier granulation layer.

10. The method according to claim 1, wherein the barrier granulation layer is formed so as to have a layer thickness ranging from 0.3 mm to 3 mm.

11. The method according to claim 1, wherein a bubble-containing $SiO_2$ sealing layer, is present on the surface of the transparent inner layer, and the bubble-containing $SiO_2$ sealing layer is removed by burning off with plasma.

12. The method according to claim 1, wherein the $SiO_2$ particles of the barrier layer granulation have a $D_{50}$ value less than 20 µm.

13. The method according to claim 1, wherein the $SiO_2$ particles of the outer layer granulation have a $D_{50}$ value greater than 120 µm.

* * * * *